(12) United States Patent
Zeng et al.

(10) Patent No.: US 11,215,672 B2
(45) Date of Patent: Jan. 4, 2022

(54) BATTERY DETECTION METHOD

(71) Applicant: AMLOGIC (SHANGHAI) CO., LTD., Shanghai (CN)

(72) Inventors: Tao Zeng, Shanghai (CN); Yong Wang, Shanghai (CN)

(*) Notice: Subject to any disclaimer, the term of this patent is extended or adjusted under 35 U.S.C. 154(b) by 0 days.

(21) Appl. No.: 16/652,582

(22) PCT Filed: Sep. 17, 2018

(86) PCT No.: PCT/CN2018/105973
§ 371 (c)(1),
(2) Date: Mar. 31, 2020

(87) PCT Pub. No.: WO2019/057006
PCT Pub. Date: Mar. 28, 2019

(65) Prior Publication Data
US 2020/0241076 A1    Jul. 30, 2020

(30) Foreign Application Priority Data
Sep. 21, 2017   (CN) .......................... 201710861595.3

(51) Int. Cl.
*G01R 31/389* (2019.01)
*G01R 31/392* (2019.01)
*G01R 35/00* (2006.01)

(52) U.S. Cl.
CPC ......... *G01R 31/389* (2019.01); *G01R 31/392* (2019.01); *G01R 35/005* (2013.01)

(58) Field of Classification Search
None
See application file for complete search history.

(56) References Cited

U.S. PATENT DOCUMENTS

| 2004/0160224 A1* | 8/2004 | Yamazaki | G01R 31/392 |
| | | | 324/426 |
| 2015/0234028 A1* | 8/2015 | Lin | G01R 31/3828 |
| | | | 324/426 |

FOREIGN PATENT DOCUMENTS

| CN | 102262216 | 11/2011 |
| CN | 103592508 | 2/2014 |
| CN | 104991189 | 10/2015 |

* cited by examiner

*Primary Examiner* — Jas A Sanghera
(74) *Attorney, Agent, or Firm* — Clement Cheng

(57) ABSTRACT

The present invention relates to the technical field of battery detection, and in particular, to a battery detection method, comprising: step S1, selecting, within a preset voltage interval, a preset number of voltage calibration values according to a rated parameter of a battery; step S2, performing charge and discharge tests on the battery, and recording a coulometer reading and a charge and discharge curve, corresponding to each voltage calibration value, of the battery; and step S3, calibrating the charge and discharge curve on the basis of the coulometer readings. The technical solution can acquire an accurate battery charge and discharge curve, is not limited by the calibration platform provided by the manufacture, can adapt to various battery models, and has high reliability and real-time performance.

6 Claims, 2 Drawing Sheets

BATTERY DETECTION METHOD

BACKGROUND OF THE INVENTION

1. Field of the Invention

The invention relates to the technical field of battery detection, and more particularly, to a battery detection method.

2. Description of the Related Art

With the popularity of embedded and intelligent platforms, shipments of various handheld devices are growing dramatically. On the handheld devices such as tablets and smart phones etc., batteries and PMU (Power Management Unit) devices are essential components. In particular, the PMU is responsible for managing the charge and discharge of the battery. At present, most of the PMU devices have built-in coulometers, and the calculation of the battery electric quantity is done by the coulometer. However, different batteries have different usage properties due to various factors such as manufactures, processes and materials. In order to accurately calculate the electric quantity of the battery, each PMU manufacturer will always provide a development platform; put the battery sample on the platform; operate the PMU device through the host computer to control the charge and discharge of the battery; and then calculate the electric quantity characteristic curve and other related parameters.

The battery calibration platform provided by the PMU device manufacture has the following disadvantages: only a part of the battery samples can be calibrated, therefore, data is not universal; during the production process, sources of materials for the batteries are not always the same, that is, there are many suppliers. Moreover, there is a limited number of calibration platforms provided by the manufactures, for example only one in many cases. When multiple batteries need to be calibrated, it needs to be done one by one; therefore, it is quite time-consuming and inefficient; battery characteristics, especially internal resistance parameters, are greatly affected by the actual layout of a printed circuit board of the hardware, since the calibration is performed on the development platform provided by the PMU manufacture, and it is obvious that parameters of the battery obtained by calibration are not applicable to a target operating platform; the charge and discharge efficiency of the battery is not considered in the battery calibration scheme provided by the manufacture. Since the electric quantity charging into the battery is not 100% converted into energy and stored in the battery, thus after a period of error accumulation, the percentage of the electric quantity obtained by a software according to the parameters is inaccurate. In this case, the electric quantity of the battery displayed on the UI may be 100%, but it turns out that the device shuts down very soon.

SUMMARY OF THE INVENTION

Aiming at the above-mentioned problems in the prior art, the present invention provides a battery detection method, comprising:

step S1, selecting, within a preset voltage interval, a preset number of voltage calibration values according to a rated parameter of a battery;

step S2, performing charge and discharge tests on the battery, and recording a coulometer reading and a charge and discharge curve, corresponding to each voltage calibration value, of the battery; and step S3, calibrating the charge and discharge curve on the basis of the coulometer readings.

In the battery detection method, the preset number of voltage calibration values is 16.

In the battery detection method, the preset voltage interval is between 3.0 V and 4.2 V.

In the battery detection method, the charge and discharge curve comprises a charge curve and a discharge curve.

In the battery detection method, wherein in step S2, extracting an energy value corresponding to each of the voltage calibration values in the charge curve and the discharge curve, respectively, while recording the charge curve and the discharge curve.

In the battery detection method, wherein in step S2, extracting an energy ratio value corresponding to each voltage calibration value in the charge curve and the discharge curve, respectively;

the energy ratio value is a ratio of the energy value to a rated total energy value of the battery.

In the battery detection method, wherein in step S1, a zero electric quantity reference value and a full electric quantity reference value are set among the voltage calibration values.

In the battery detection method, the zero electric quantity reference value is 3.55 V; and the full electric quantity reference value is 4.15 V.

By adopting the above-mentioned technical solutions, the present invention has the following beneficial effects: a battery detection method provided in the present invention can acquire an accurate battery charge and discharge curve, can obtain data without the calibration platform provided by the manufacture, can adapt to various battery models, and has high reliability and real-time performance.

BRIEF DESCRIPTION OF THE DRAWINGS

The accompanying drawings, together with the specification, illustrate exemplary embodiments of the present disclosure, and, together with the description, serve to explain the principles of the present invention.

DETAILED DESCRIPTION

Figure 1:
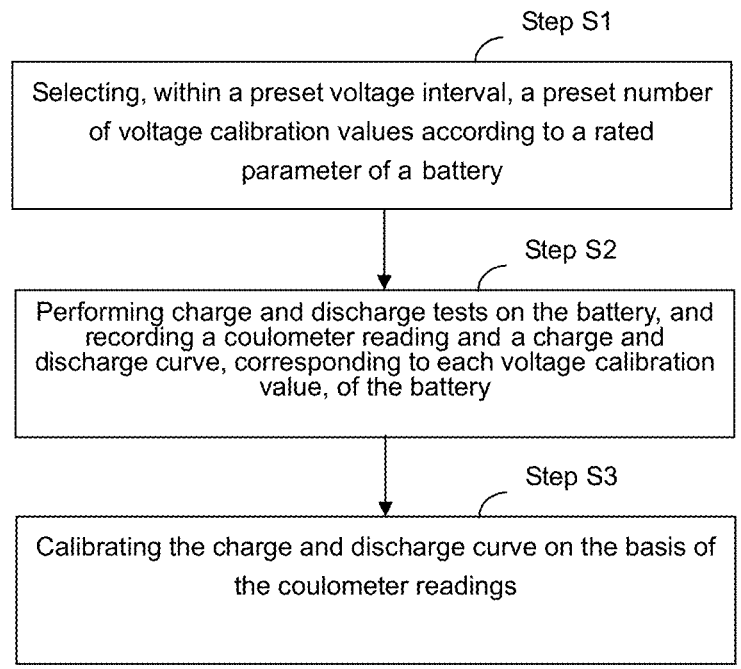
FIG. 1 is a flow chart showing steps of a battery detection method according to an embodiment of the present invention.
Figure 2:
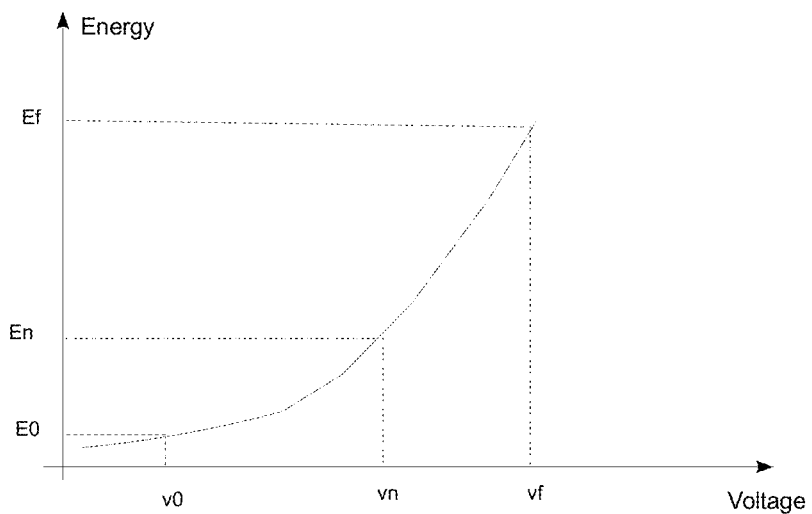
FIG. 2 is a graph showing the energy under different voltages in a battery detection method according to an embodiment of the present invention.

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, the term "plurality" means a number greater than one.

Hereinafter, certain exemplary embodiments according to the present disclosure will be described with reference to the accompanying drawings.

In a preferred embodiment, as shown in FIG. 1, there is provided a battery detection method, comprising:

step S1, selecting, within a preset voltage interval, a preset number of voltage calibration values according to a rated parameter of a battery;

step S2, performing charge and discharge tests on the battery, and recording a coulometer reading and a charge and discharge curve, corresponding to each voltage calibration value, of the battery; and step S3, calibrating the charge and discharge curve on the basis of the coulometer readings.

In the above-mentioned technical solution, P=U*I, wherein U is voltage, I is current. For example, charging the battery with the current of 1 A when the voltage of the battery is 3.0 V, and charging the battery with the current of 1 A when the voltage of the battery is 4V, however, the power flowing into the battery in both cases is different. In addition, E=P*T=(U*I)*T=U*C, wherein C is a variation value of a coulometer. A product of the variation value of the coulometer and the voltage of the battery can be taken as a result which is used in the calculation of battery curve parameters, so as to avoid an error due to an operation that the battery curve parameters are calculated based on the coulometer readings only.

In a preferred embodiment, the preset number of voltage calibration values is 16.

In a preferred embodiment, the preset voltage interval is between 3.0 V and 4.2 V.

In a preferred embodiment, the charge and discharge curve comprises a charge curve and a discharge curve.

In the above-mentioned embodiment, in step S2, it is preferably that extracting an energy value corresponding to each of the voltage calibration values in the charge curve and the discharge curve, respectively, while recording the charge curve and the discharge curve.

In the above-mentioned embodiment, in step S2, it is preferably that extracting an energy ratio value corresponding to each voltage calibration value in the charge curve and the discharge curve, respectively;

the energy ratio value is a ratio of the energy value to a rated total energy value of the battery. In a preferred embodiment, in step S1, a zero electric quantity reference value and a full electric quantity reference value are set among the voltage calibration values.

In the above-mentioned embodiment, it is preferably that the zero electric quantity reference value is 3.55 V; and
the full electric quantity reference value is 4.15 V.

Figure 3:
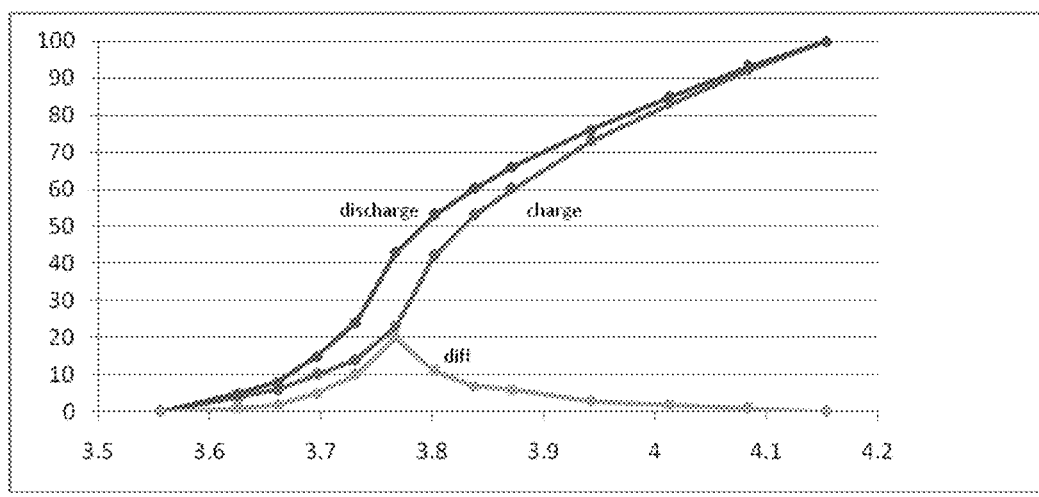
FIG. 3 is a graph showing the charge, discharge and a difference therebetween in a battery detection method according to an embodiment of the present invention.

In the above-mentioned technical solution, FIG. 3 is a percentage curve parameter obtained by using the 3.55V as the zero electric quantity reference value and 4.15V as the full electric quantity reference value on a certain model of battery. There are two curves, namely, a charge curve and a discharge curve. Due to the internal resistance, for a given voltage, the electric quantity percentage during the discharging process is higher than that during the charging process (the horizontal axis is the voltage, and the longitudinal axis is the percentage). And a difference curve is a difference between the charge curve and the discharge curve.

Specifically, calculation of the internal resistance can be carried out by using the following method: Vbat=I×rdc+ocv, wherein Vbat is the voltage of the battery as measured by the PMU, I is the charging current configured by the PMU, and ocv is an open-circuit voltage of the battery. During the charging process, ocv hardly changes in a short period of time, thus, the internal resistance can be calculated by controlling the variation of the current. First of all, charging the battery with a lower current $I_{Lo}$, recording the $I_{Lo}$ and a lower voltage $Vbat_{Lo}$ at this point, then charging the battery with a higher current $I_{Hi}$, and then recording the $I_{Hi}$ and a higher voltage $Vbat_{Hi}$, then there are formulas:

$$Vbat_{Lo} = I_{Lo} \times rdc + ocv$$

$$Vbat_{Hi} = I_{Hi} \times rdc + ocv$$

The value of the internal resistance can be obtained by using the two formulas as described above:

$$rdc = \frac{Vbat_{Hi} - Vbat_{Lo}}{I_{Hi} - I_{Lo}}$$

With reference to detailed description and the accompanying drawings, typical embodiments of a particular structure of the detailed description are given; while other transformation of the particular structure may be done without departing from the spirit of the present invention. Although the existing preferred embodiments are put forward in the present invention, the present invention is not limited thereto.

Variations and modifications of the present invention will be more apparent to those skilled in the art with reference to the above-mentioned detailed description. Therefore, it is intended to cover all variations and modifications within the true purpose and scope of the present invention as defined by the appended claims. Any and all the equivalents are construed to fall within the purpose and scope of the present invention.

What is claimed is:

1. A battery detection method, comprising:
    step S1, selecting, within a preset voltage interval, a preset number of voltage calibration values according to a rated parameter of a battery;
    step S2, performing charge and discharge tests on the battery, and recording a coulometer reading and a charge and discharge curve, corresponding to each voltage calibration value, of the battery; and step S3, calibrating the charge and discharge curve on the basis of the coulometer readings;

the charge and discharge curve comprises a charge curve and a discharge curve; wherein in step S2, extracting an energy value corresponding to each of the voltage calibration values in the charge curve and the discharge curve, respectively, while recording the charge curve and the discharge curve.

2. The battery detection method of claim 1, wherein the preset number of voltage calibration values is 16.

3. The battery detection method of claim 1, wherein the preset voltage interval is between 3.0 V and 4.2 V.

4. The battery detection method of claim 1, wherein in step S2, extracting an energy ratio value corresponding to each voltage calibration value in the charge curve and the discharge curve, respectively;

the energy ratio value is a ratio of the energy value to a rated total energy value of the battery.

5. The battery detection method of claim 1, wherein in step S1, a zero electric quantity reference value and a full electric quantity reference value are set among the voltage calibration values.

6. The battery detection method of claim 5, wherein the zero electric quantity reference value is 3.55 V; and the full electric quantity reference value is 4.15 V.

* * * * *